(12) United States Patent
Weale et al.

(10) Patent No.: US 11,139,552 B1
(45) Date of Patent: Oct. 5, 2021

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventors: Gareth Pryce Weale, New Hamburg (CA); Joseph Steffler, Waterloo (CA)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/867,218

(22) Filed: May 5, 2020

(51) Int. Cl.
*H01L 23/66* (2006.01)
*H01Q 1/22* (2006.01)
*H01L 21/768* (2006.01)
*H01L 23/482* (2006.01)

(52) U.S. Cl.
CPC ......... *H01Q 1/2283* (2013.01); *H01L 21/768* (2013.01); *H01L 23/482* (2013.01); *H01L 23/66* (2013.01)

(58) Field of Classification Search
None
See application file for complete search history.

(56) References Cited

U.S. PATENT DOCUMENTS

| | | | |
|---|---|---|---|
| 5,095,357 A | 3/1992 | Andoh et al. | |
| 5,831,331 A | 11/1998 | Lee | |
| 6,429,504 B1 | 8/2002 | Beaussart et al. | |
| 2005/0134507 A1 | 6/2005 | Dishongh et al. | |
| 2006/0181385 A1 | 8/2006 | Hurley | |
| 2011/0279333 A1 | 11/2011 | Hong et al. | |
| 2012/0266116 A1 | 10/2012 | Ding et al. | |
| 2017/0125881 A1 | 5/2017 | Mangrum et al. | |
| 2017/0186726 A1* | 6/2017 | Tang | H01L 25/065 |
| 2018/0151518 A1* | 5/2018 | Shen | H01L 23/3121 |
| 2018/0159216 A1* | 6/2018 | Kai | H01L 23/552 |

OTHER PUBLICATIONS

On Semiconductor, "RSL10 SIP—Bluetooth 5 System-in-Package (SiP)," Publication Order No. RSL10SIP/D, Semiconductor Components Industries, LLC, 2018, Dec. 2018—Rev. 0, 20 pages.

\* cited by examiner

*Primary Examiner* — Benjamin P Sandvik
(74) *Attorney, Agent, or Firm* — Robert F. Hightower

(57) ABSTRACT

In an embodiment, an antenna may be formed by applying an insulator to a package body and forming at least a portion of the antenna as a conductor on the insulator.

20 Claims, 5 Drawing Sheets

METHOD OF FORMING A SEMICONDUCTOR DEVICE

BACKGROUND

The present invention relates, in general, to electronics, and more particularly, to semiconductors, structures thereof, and methods of forming semiconductor devices.

In the past, the electronics industry utilized various methods and structures to form antennas for various types of equipment. Some antenna applications included antennas for cellular telephones and other radio frequency related equipment. In some applications, the antenna was often mounted on a flexible circuit board or on a printed circuit board and positioned next to electronic components. The space on the flexible circuit board or printed circuit board was limited, which could limit the surface area of the antenna. Additionally, assembling the antenna onto the circuit board generally required complex assembly techniques which could increase the cost of the equipment using the antenna.

As the industry migrated to using higher frequencies, multiple antennas often were needed to meet the standards for the higher frequencies. Attaching multiple antennas to the circuit board also increased the complexity of the assembly and increased the cost.

Accordingly, it is desirable to have an antenna and a method of forming the antenna that provides more area for the antenna, that simplifies assembly of the antenna, or that reduces cost of the system using the antenna.

Figure 1:
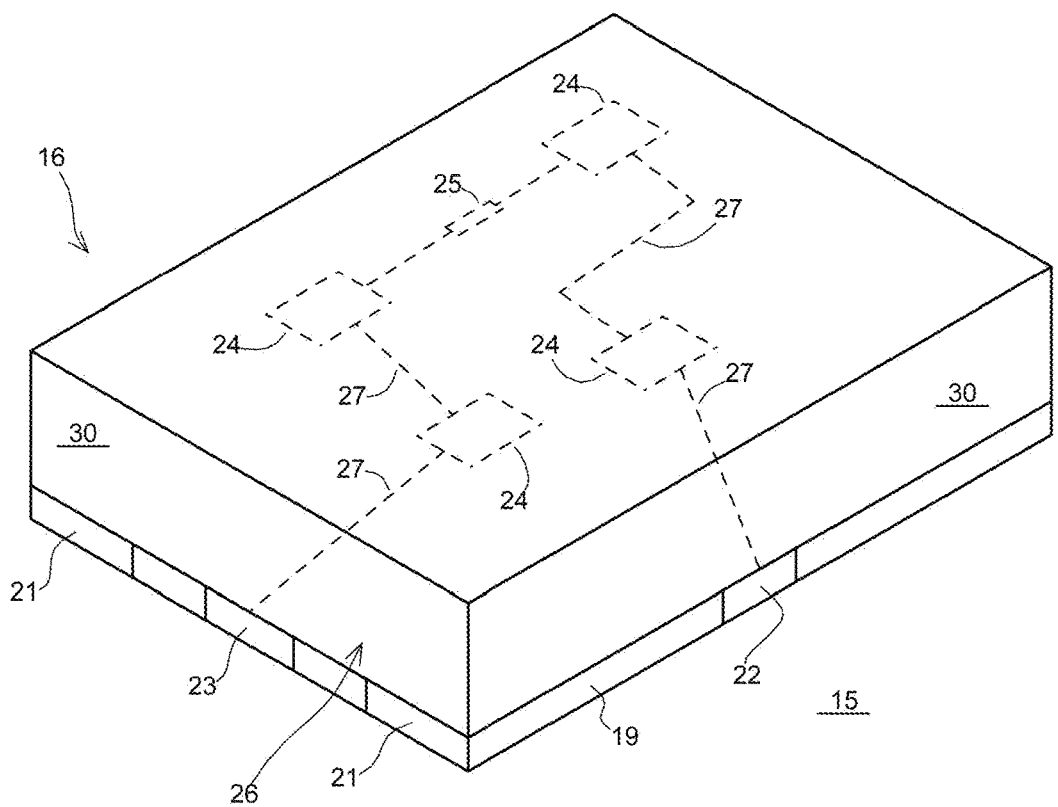
FIG. 1 illustrates an enlarged isometric view of an example of a portion of an embodiment of a semiconductor device package at a stage in an embodiment of a method of forming the package in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, regions of device structures are illustrated as having generally straight line edges and precise angular corners. However, those skilled in the art understand that the edges generally may not be straight lines and the corners may not be precise angles.

The embodiments illustrated and described hereinafter may have embodiments and/or may be practiced in the absence of any element which is not specifically disclosed herein.

DETAILED DESCRIPTION

FIG. 1 illustrates an enlarged isometric view of an example of a portion of an embodiment of a semiconductor device package 15 at a stage in an embodiment of a method of forming package 15. Package 15 includes a substrate 19 that has semiconductor devices 24, illustrated by dashed lines, attached thereto. A protective coating 26 typically is formed on a surface of substrate 19 and covers devices 24.

Substrate 19 may be formed as a printed circuit board or alternately a ceramic substrate or other means to establish electrical connectivity to the various electronic components. In embodiment, substrate 19 is not formed from a semiconductor material. Substrate 19 may have major surfaces that have an area that is greater than the area of other surfaces. For example, a top surface and a bottom surface of substrate 19 may have areas that are much larger than the area of the sides that extend between the top surface and the bottom surface of substrate 19. Coating 26 may be formed on at least one of the major surfaces, for example a top surface or a first major surface. A second major surface, or bottom surface, of substrate 19 that is opposite to coating 26 may have conductors for connecting package 15 to another substrate. For example, the second major surface may include surface mount conductors such as conductive bumps, or ball-grid array conductors, or other types of surface mount conductors.

In an embodiment, coating 26 is not formed on at least one of the sides of substrate 19. In some embodiments, coating 26 may form a package body for package 15. Coating 26 may be formed by over-molding a protective material on substrate 19 or may be formed by other means such as injection molding, or forming a dam-bar around substrate 19 and pouring material onto substrate 19. In some embodiments, the material used to form coating 26 may be polyimide or other types of protectant materials. For example, coating 26 may be a magneto-dielectric material or an epoxy or other suitable plastic material that may be used for a substrate for an antenna. Coating 26 includes sides 30 that extend laterally along an outside perimeter of substrate 19 and extend upward from substrate 16 to a height that is greater than the height of devices 24.

Devices 24 are attached to substrate 19. Devices 24 may be attached to substrate 19 by soldering or other means. Passive devices 25 (illustrated by dashed lines), such as for example capacitors and/or resistors, may also be attached to substrate 19. Conductors 27 (illustrated by dashed lines) may be formed on substrate 19 and may be used to form connections between devices 24 and 25. Conductors 27 and devices 24-25 are illustrated by dashed lines because they are underneath coating 26. Conductors 27 may have an embodiment as metal conductors that are formed on a surface of substrate 19. In some embodiments, substrate 19 may have multiple layers such that some of conductors 27 may be formed in different layers of substrate 19.

An embodiment of substrate 19 may have an interconnect conductor along at least one of the sides of substrate 19. For example, substrate 19 may include interconnect conductors 21 and 23 formed along one side substrate 19 and may include an interconnect conductor 22 that may be formed along a different side of substrate 19. An embodiment of one or more of conductors 21-23 may be exposed at least along one of the edges of package 15. One or more of conductors 21-23 may extend internally to substrate 19 to make an electrical connection to one or more of devices 24-25 such as through one or more of conductors 27. In an embodiment, coating 26 does not cover one or more of conductors 21-23. An embodiment of package 15 may include that any one of conductors 21-23 may be a conductor for forming a radio frequency (RF) connection to one of devices 24. For example, conductor 23 may be configured as a RF connection. An embodiment may also include that one of conductors 21-23 may be a conductor to form a reference voltage connection to substrate 19. For example, conductors 21 and 22 may be configured to be connected to a common return, or alternately to a ground reference or ground return, for the circuits that are on substrate 19.

Figure 2:
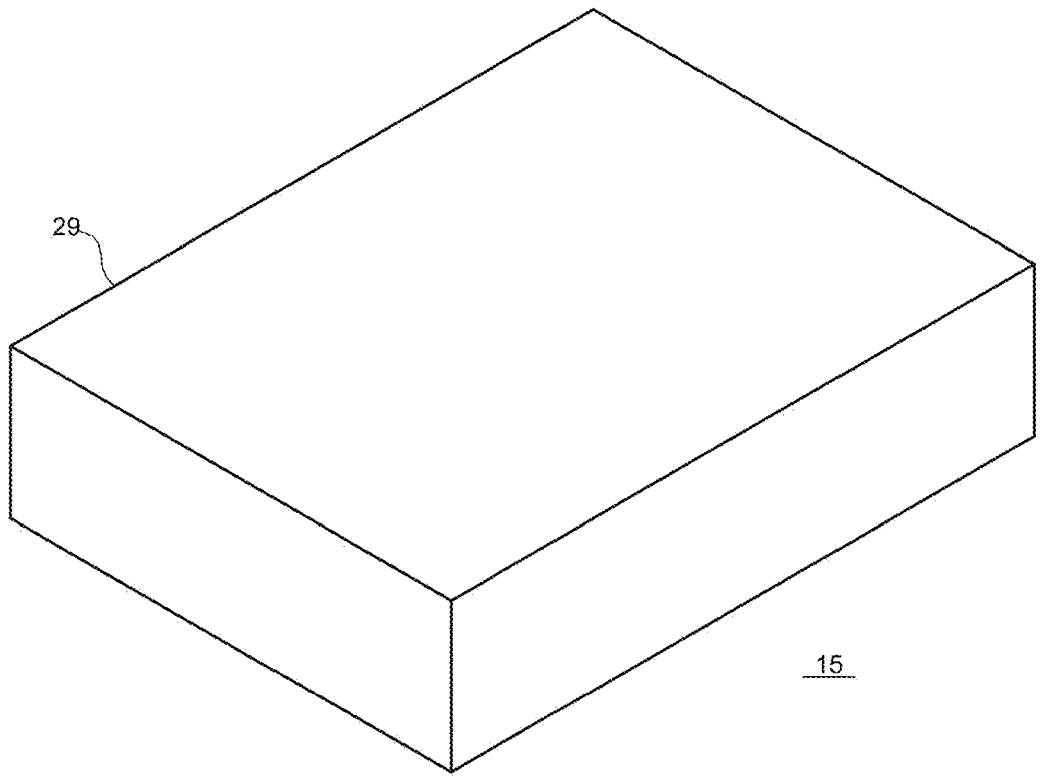
FIG. 2 illustrates the package of FIG. 1 at a subsequent stage of an example of an embodiment of a method of forming the package in accordance with the present invention.

FIG. 2 illustrates package 15 at a subsequent stage of an example of an embodiment of a method of forming package 15. A conductor material may be formed on package 15 to form a conductor 29. For example, conductor material may be sputtered onto coating 26 and onto the sides of substrate 19. The conductor material may be a metal such as for example copper, gold or silver or other conductive material with sufficient conductance. An embodiment of conductor 29 may be formed to cover all of coating 26 and at least one or more of conductors 21-23. In an embodiment, conductor 29 may be formed on the top and the exposed sides of substrate 19. An embodiment may include that the bottom side which contains the electrical interconnects of the substrate does not get coated.

Figure 3:
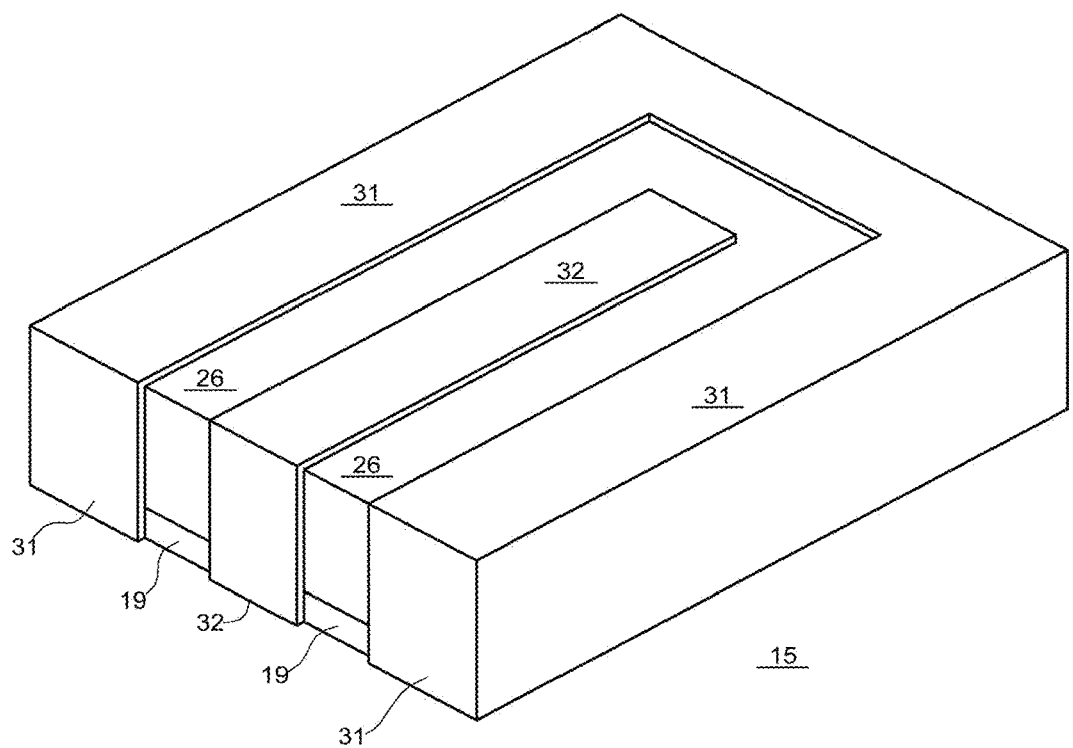
FIG. 3 illustrates the package at another subsequent stage in an example of an embodiment of a method of forming the package in accordance with the present invention.

FIG. 3 illustrates package 15 at another subsequent stage in an example of an embodiment of a method of forming package 15. A portion of conductor 29 may be removed to form a conductor 32 that extends from connector 23 on the side of substrate 19, up and along side 30 of coating 26, and to extend laterally or horizontally across a portion of the surface of coating 26 that is overlying the first major surface of substrate 19. Removing the portion of conductor 29 also leaves another portion of conductor 29 as a conductor 31. Conductor 31 is formed along at least one side of substrate 19 adjacent to conductor 32 such that conductor 31 forms an electrical connection to conductors 21 and extends from conductors 21 up on side 30 and continues laterally or horizontally across another portion of the surface of coating 26 that overlies the first major surface of substrate 19. Portions of the material of conductor 29 may also remain to form conductor 31 along an adjacent side of substrate 19 to electrically connect to conductor 22 and to extend up onto coating 26.

In an embodiment, a mask may be applied to the portions of conductor 29 that will form conductors 31 and 32 and the exposed portions of conductor 29 may be removed. For example, the exposed portions of conductor 29 may be removed by etching such as with a wet etch or a dry etch. Alternately, the exposed portions may be removed using a mechanical ablation.

An embodiment may include using a laser, or other material removal process, to directly remove the portions of conductor 29. Thus, a mask may not be used for the laser removal process. In other embodiments, conductor 29 may not be formed and a mask may be applied to coating 26 and patterned to cover the portions of coating 26 where conductors 31 and 32 are not formed. Thereafter, a conductor material may be applied to directly form conductors 31 and 32. Thus, conductors 31 and 32 may be formed on coating 26. Thereafter, the mask material may be removed.

Figure 4:
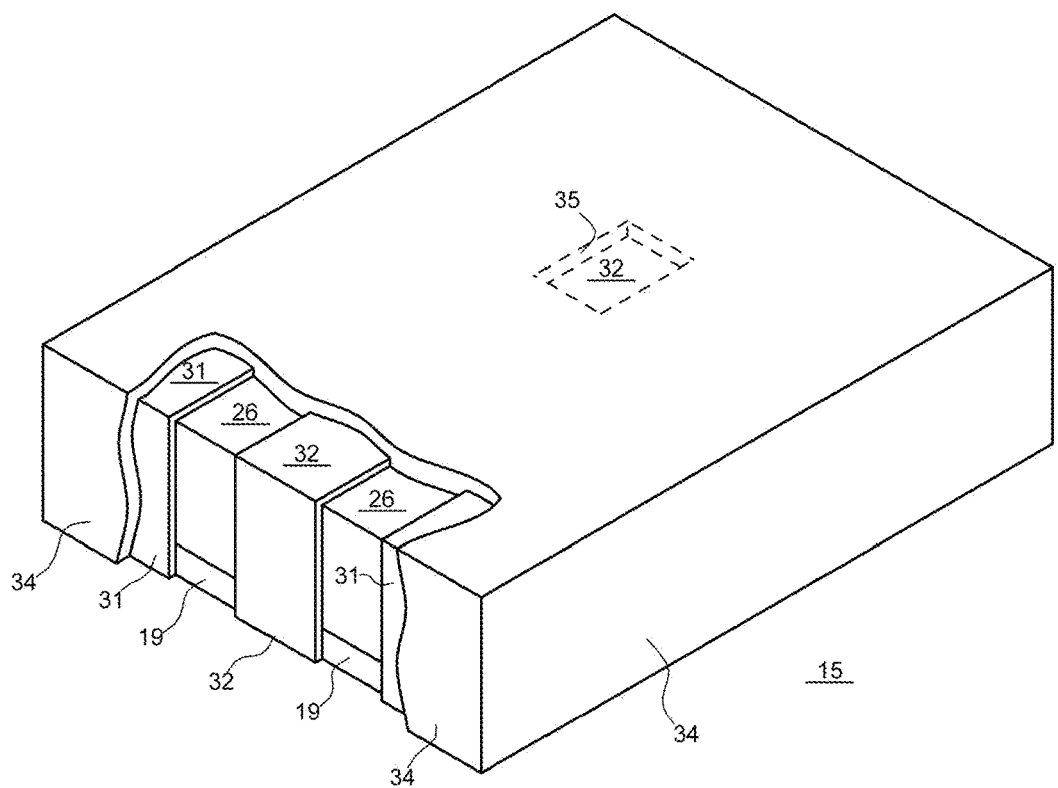
FIG. 4 illustrates a cutaway view of the package at another stage of an example of an embodiment of a method of forming the package in accordance with the present invention.

FIG. 4 illustrates a cutaway view of package 15 at another stage of an example of an embodiment of a method of forming package 15. An insulator 34 may be formed at least on conductors 31 and 32. An embodiment of insulator 34 may be formed to overlie at least one major surface and one or more of the sides of package 15, or alternately on one major surface of and one or more of sides 30 of coating 26. In an embodiment, insulator 34 may be formed to cover all of conductors 31 and 32 and also may be formed on exposed portions of coating 26. Insulator 34 may have an embodiment that may be formed from a material having a high dielectric constant. For example, a material having a dielectric constant that is greater than five (5.0) or alternately having a dielectric constant no less than eight and a half (8.5). An embodiment may include that insulator 34 may be formed from a dielectric material, or alternatively from a ceramic material, or alternately from aluminum nitride (AlN) or silicon nitride (SiN), or alternatively from a ceramic powder.

An opening 35 may be formed through insulator 34 to expose a portion of conductor 32. Opening 35 will facilitate forming an electrical connection through insulator 34 to conductor 32.

Figure 5:
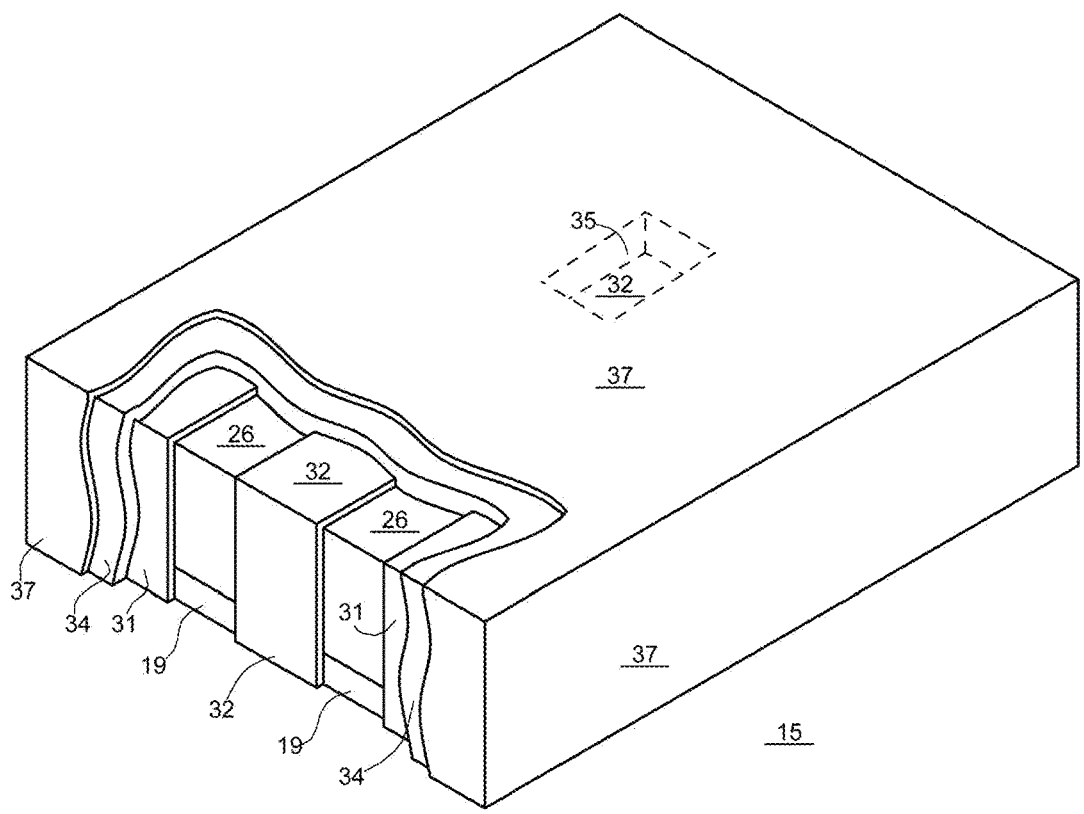
FIG. 5 illustrates another cutaway view of the package at another stage of an example of an embodiment of a method of forming the package in accordance with the present invention.

FIG. 5 illustrates a cutaway view of package 15 at another stage of an example of an embodiment of a method of forming package 15. A conductor material or conductor 37 may be formed on at least a portion of insulator 34. In an embodiment, conductor 37 may be formed to cover insulator 34. In other embodiments, conductor 37 may be formed only on the surface of insulator 34 where it is desired to form an antenna pattern. In an embodiment, conductor 37 may be formed only on a portion of the surface of insulator 34 that is overlying the first major surface of substrate 19. A portion of conductor 37 extends into opening 35, illustrated by a dashed box, so that conductor 37 physically and electrically connects to conductor 32.

Figure 6:
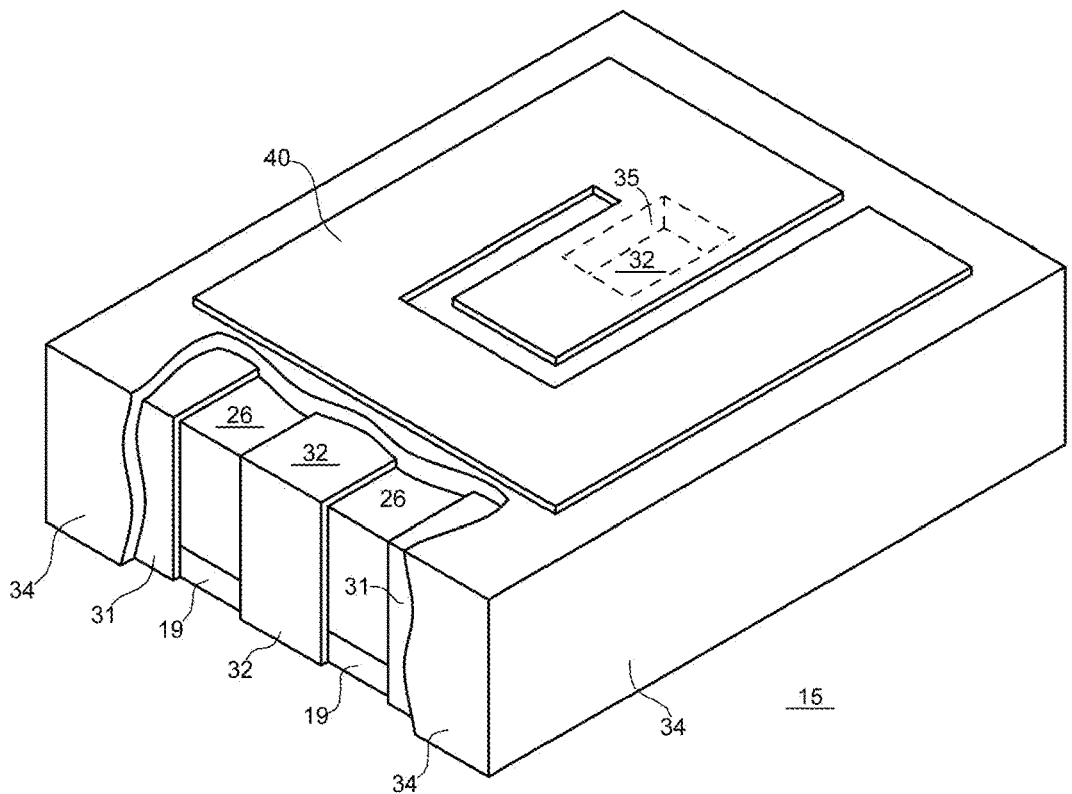
FIG. 6 illustrates yet another cutaway view of the package at another subsequent stage of an example of an embodiment of a method of forming the package in accordance with the present invention.

FIG. 6 illustrates yet a cutaway view of package 15 at another subsequent stage. In an embodiment, a portion of the material of conductor 37 may be removed from package 15 to form a conductor 40 in a pattern of an antenna. In an embodiment, a mask may be applied to conductor 37 and patterned to have openings to expose a portion of conductor 37 that is to be removed. The exposed portions of conductor 37 may be removed by various means such as for example by a wet etch or a dry etch or mechanical removal methods, or alternately by laser ablation.

In other embodiments, conductor 40 may be formed by other means. For example, conductor 37 may not be applied to package 15. A mask may be applied to package 15 and patterned to have an opening where conductor 40 is to be formed. Thereafter, a conductor material may be applied, such as for example by sputtering, onto package 15 to form conductor 40.

In an embodiment, conductor 40 may be formed in a pattern of substantially a square spiral pattern on a portion of the surface of insulator 34 that is overlying the first major surface of substrate 19. A portion of conductor 40 extends into opening 35 and makes an electrical connection to conductor 32 and through conductor 32 to one of semiconductor devices 24. The semiconductor device may be configured to drive conductor with an RF signal. Conductor 40 forms a radiator pattern of an antenna. Conductor 31 forms a reflector plane or ground plane for the RF operation of the antenna. Thus conductors 31 and 40 form the antenna. Conductor 32 forms a drive conductor that facilitates driving conductor with the RF signal. Antenna tuning and matching is made possible through the materials used and particular shapes of the conductors derived during the development process. The antenna size and shape in combination with the underlying materials provide the antenna impedance and radiation efficiency, both of which are parameters for the antenna.

Those skilled in the art will appreciate that conductor 40 may be formed into other antenna patterns in addition to the square spiral pattern illustrated in FIG. 6.

Figure 7:
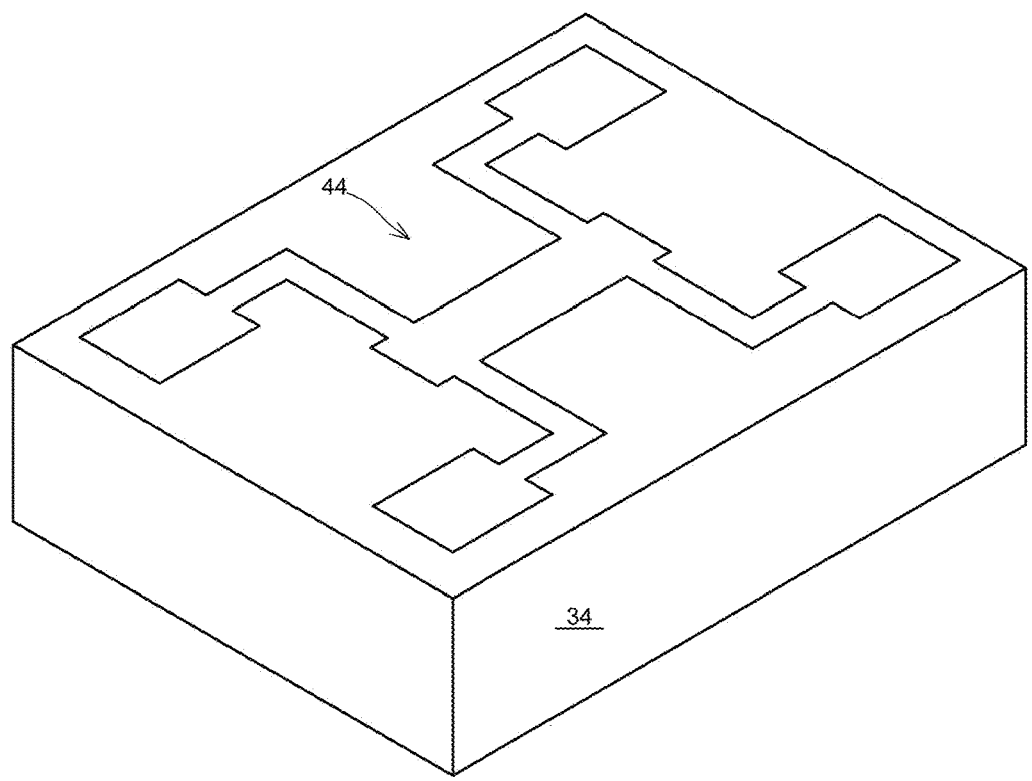
FIG. 7 illustrates a conductor formed into an antenna pattern in accordance with the present invention.

FIG. 7 illustrates conductor 40 formed into an antenna pattern 44. AN antenna pattern is designed to present the desired radiative behavior at the necessary frequencies for the unit. The design parameters being the material stack, the stack heights, the radiator size and shape. The patterns of FIGS. 7-10 are example shapes.

Figure 8:
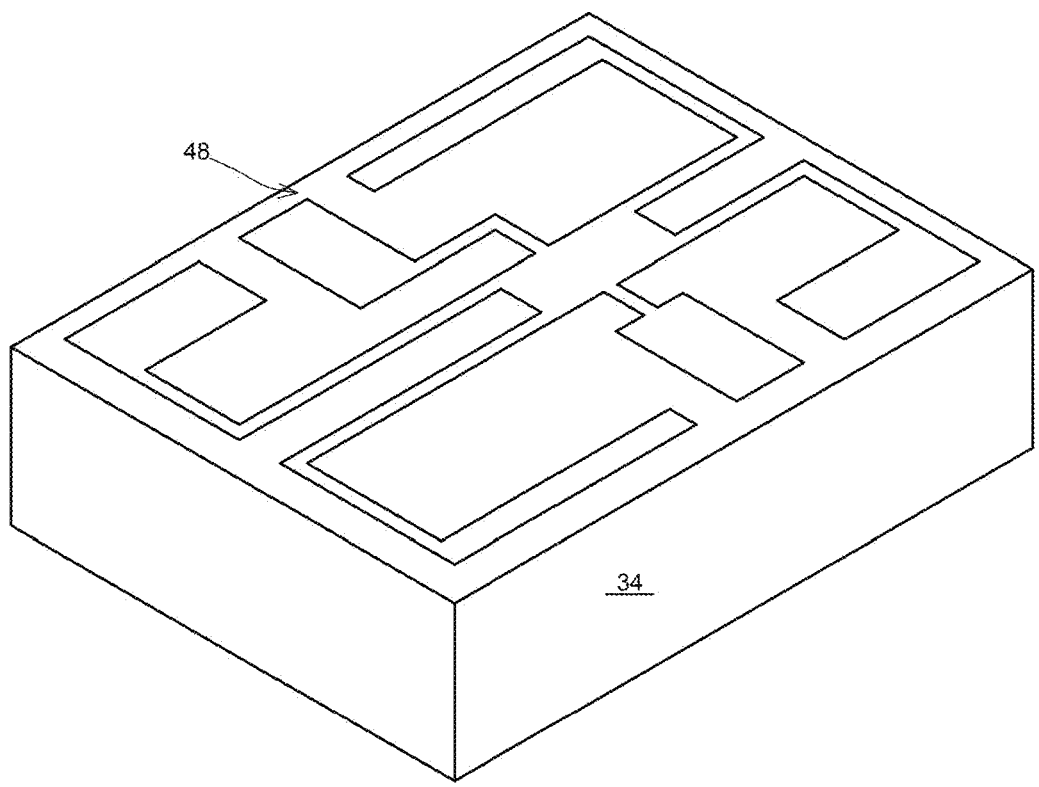
FIG. 8 illustrates a conductor formed into another antenna pattern in accordance with the present invention.

FIG. 8 illustrates conductor 40 formed into an antenna pattern 48.

Figure 9:
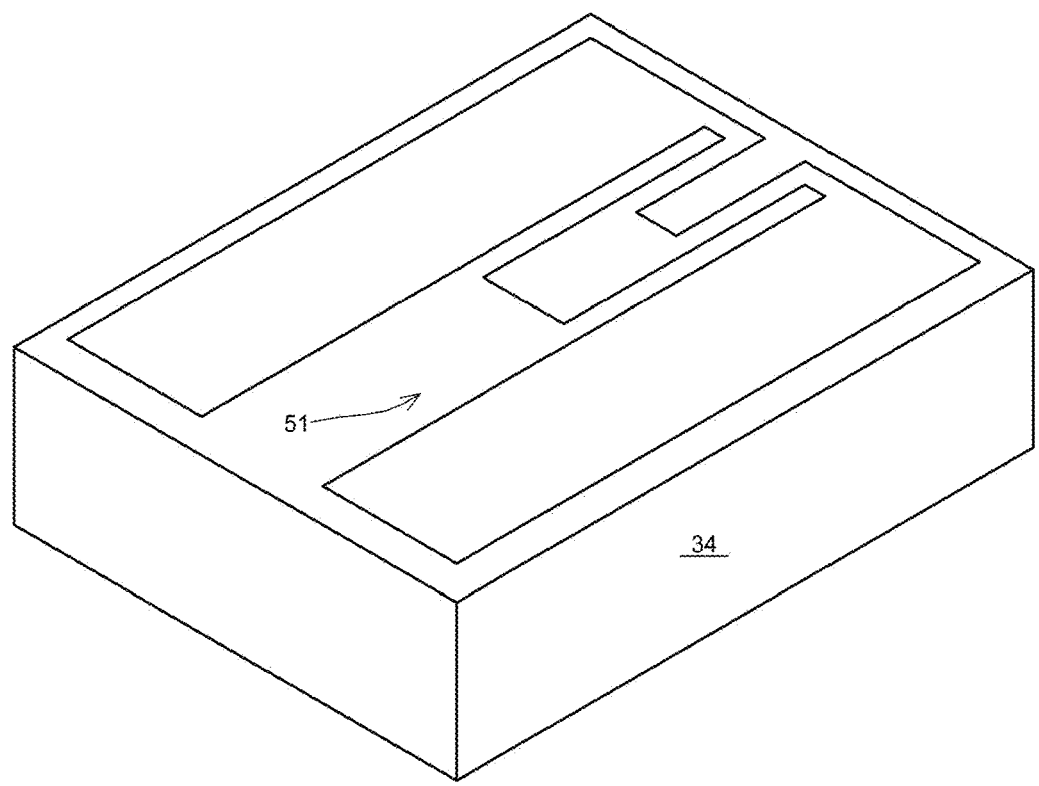
FIG. 9 illustrates a conductor formed into yet another antenna pattern in accordance with the present invention.

FIG. 9 illustrates conductor 40 formed into an antenna pattern 51.

Figure 10:
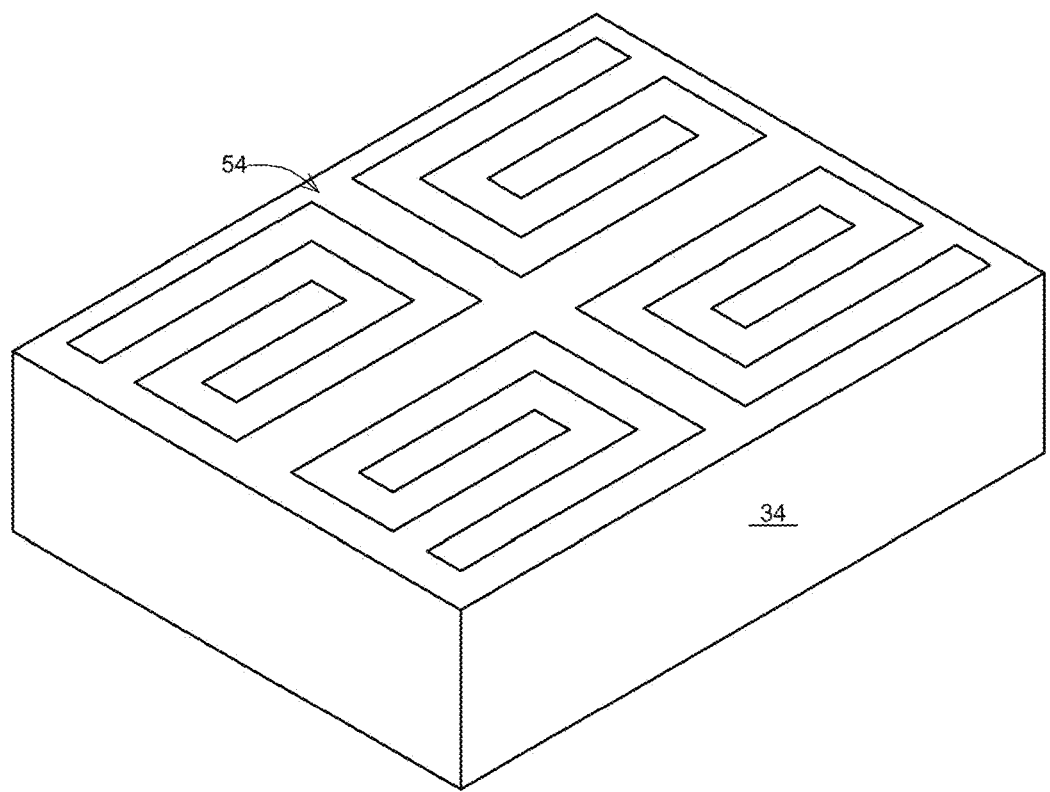
FIG. 10 illustrates a conductor formed into still another antenna pattern in accordance with the present invention.

FIG. 10 illustrates conductor 40 formed into four antennas in a pattern 54. An embodiment may include that an electrical connection is established through opening 35 down to conductor 32 under the box in the middle of the antenna pattern.

From all the foregoing, one skilled in the art will appreciate that an example of an embodiment of a method of forming an antenna on a package for a semiconductor device may comprise:

providing a substrate, such as for example substrate 19, having interconnect conductors, such as for example one or more of conductors 28/21-23, formed at least on an edge of the substrate;

providing semiconductor devices, such as for example devices 24, on the substrate;

providing a first protective coating, such as for example coating 26, on the substrate and covering the semiconductor devices, the first protective coating having sides that extend from the substrate upward away from the substrate wherein the first protective coating does not cover the interconnect conductors on the edge of the substrate;

forming a first conductor, such as for example one or more of conductors 31/32, on the first protective coating wherein a first portion of the first conductor abuts and makes an electrical connection to one or more of the interconnect conductors on the edge of the substrate;

removing a portion of the first conductor to form a second conductor, such as for example conductor 31, on the first protective coating and a third conductor, such as for example conductor 32, on the first protective coating, the second conductor electrically connected to at least a first one of the interconnect conductors, the third conductor electrically connected to at least a second one of the interconnect conductors;

forming a first insulator, such as for example insulator 34, covering the first conductor and the second conductor;

removing a portion, such as for example portion 35, of the first insulator to form an opening, such as for example opening 35, through the first insulator and expose a portion of the third conductor;

forming a fourth conductor, such as for example conductor 40, on the first insulator wherein a portion of the fourth conductor extends into the opening and abuts the portion of the third conductor and makes an electrical connection thereto; and removing portions of fourth conductor to form the fourth conductor into a pattern of an antenna wherein the fourth conductor makes an electrical connection through the third conductor to a first semiconductor device of the semiconductor devices wherein the first semiconductor device is configured to drive the fourth conductor with an RF signal.

The method may also have an embodiment that may include forming the first conductor on the sides of the first protective coating and on a top of the first protective coating that overlies one or more of the semiconductor devices.

An embodiment may include forming the second conductor not directly electrically connected to the third conductor.

The method may have an embodiment that may include forming the first insulator covering all of the second conductor and the third conductor and thereafter forming the opening.

An embodiment of the method may include forming the second conductor electrically connected to an interconnect conductor configured to be a ground reference.

An embodiment may include forming the first insulator from silicon nitride.

An embodiment may include forming the first insulator includes sputtering silicon nitride.

The method may have an embodiment that may include forming the first insulator from Aluminum nitride.

Another embodiment may include forming the first insulator to have a dielectric constant no less than approximately 5.0.

An embodiment may include forming the first insulator to have a dielectric constant no less than approximately 8.5.

An embodiment may include forming the fourth conductor to have a pattern of a patch antenna.

The method may have an embodiment that includes forming the fourth conductor to have a pattern of one of an antenna configured to form a substantially symmetrical pattern or an antenna configured to form multiple patterns.

In an embodiment, the method may include forming a second protective coating, such as for example the top polyimide, covering the fourth conductor and at least a portion of the first insulator.

An embodiment may include forming a second protective coating covering the fourth conductor.

Those skilled in the art will appreciate that an example of an embodiment of a semiconductor device package having an antenna may comprise:

a substrate, such as for example substrate 19, having interconnected semiconductor devices on the substrate, the semiconductor devices connected together by conductors on the substrate, the substrate having interconnect conductors at a periphery of the substrate;

a protective coating, such as for example coating 26, covering the semiconductor devices and having sides that extend away from the substrate, the protective coating not covering at least a portion of the interconnect conductors;

a first conductor, such as for example conductor 31, on the sides of the protective coating and directly electrically connected to a first interconnect conductor of the interconnect conductors;

a second conductor, such as for example conductor 32, on the protective coating and directly electrically connected to a second interconnect conductor of the interconnect conductors, the second conductor electrically connected to a first semiconductor device of the semiconductor devices wherein the first semiconductor device is configured to drive the second conductor with an RF signal;

an insulator on at least a portion of the first conductor and the second conductor; and a third conductor, such as for example conductor 40, on the insulator and electrically connected to the second conductor wherein the first semiconductor device is configured to drive the third conductor and the second conductor with the RF signal.

An embodiment may include that the third conductor may be configured in a pattern of an antenna.

Those skilled in the art will appreciate that an example of an embodiment of a method of forming a semiconductor device having an antenna may comprise: providing a first protective coating, such as for example coating 26, covering a substrate having semiconductor devices on the substrate;

forming a first conductor, such as for example conductor 31, and a second conductor, such as for example conductor 32, overlying the first protective coating including forming the second conductor electrically connected to a first semiconductor device of the semiconductor devices;

forming a first insulator, such as for example insulator 34, on the first conductor and the second conductor; and forming a fourth conductor, such as for example conductor 40, in a pattern of an antenna on the first insulator including electrically connecting the fourth conductor to the second conductor wherein the first semiconductor device is configured to apply an RF signal to the fourth conductor.

The method may have an embodiment that may include forming the first conductor electrically connected to common reference of the substrate.

An embodiment may include depositing conductor material in the pattern of the antenna.

In an embodiment, the method may include forming conductor material on the first insulator and removing portions of the conductor material.

In view of all of the above, it is evident that a novel device and method is disclosed. Included, among other features, is forming a conductor in an antenna pattern on a semiconductor package wherein the antenna pattern overlies semiconductor devices that are within the package. The antenna may be formed on a body of the semiconductor package. The conductor of the antenna may be formed by forming one or more conductors on a body of the semiconductor package, forming an insulator on at least a portion of the one or more conductors, then forming another conductor in a pattern of an antenna on the insulator.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. An embodiment may include that opening 35 may be formed by drilling down through coating 26 to one of conductors 27 on the substrate surface. The resulting hole or cavity may then be filled with a conductive material to establish electrical connectivity at the surface of coating 26.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming an antenna on a package for a semiconductor device comprising:
   providing a substrate having interconnect conductors formed at least on an edge of the substrate;
   providing semiconductor devices on the substrate;
   providing a first protective coating on the substrate and covering the semiconductor devices, the first protective coating having sides that extend from the substrate upward away from the substrate wherein the first protective coating does not cover the interconnect conductors on the edge of the substrate;
   forming a first conductor on the first protective coating wherein a first portion of the first conductor abuts and makes an electrical connection to one or more of the interconnect conductors on the edge of the substrate;
   removing a portion of the first conductor to form a second conductor on the first protective coating and a third conductor on the first protective coating, the second conductor electrically connected to at least a first one of the interconnect conductors, the third conductor electrically connected to at least a second one of the interconnect conductors;
   forming a first insulator covering the first conductor and the second conductor;
   removing a portion of the first insulator to form an opening through the first insulator and expose a portion of the third conductor;
   forming a fourth conductor on the first insulator wherein a portion of the fourth conductor extends into the opening and abuts the portion of the third conductor and makes an electrical connection thereto; and
   removing portions of fourth conductor to form the fourth conductor into a pattern of an antenna wherein the fourth conductor makes an electrical connection through the third conductor to a first semiconductor device of the semiconductor devices wherein the first semiconductor device is configured to drive the fourth conductor with an RF signal.

2. The method of claim 1 wherein forming the first conductor on the first protective coating includes forming the first conductor on the sides of the first protective coating and on a top of the first protective coating that overlies one or more of the semiconductor devices.

3. The method of claim 1 wherein removing the portion of the first conductor includes forming the second conductor not directly electrically connected to the third conductor.

4. The method of claim 1 wherein forming a first insulator includes forming the first insulator covering all of the second conductor and the third conductor and thereafter forming the opening.

5. The method of claim 1 wherein removing the portion of the first conductor to form the second conductor includes forming the second conductor electrically connected to an interconnect conductor configured to be a ground reference.

6. The method of claim 1 wherein forming the first insulator includes forming the first insulator from silicon nitride.

7. The method of claim 1 wherein forming the first insulator includes sputtering silicon nitride.

8. The method of claim 1 wherein forming the first insulator includes forming the first insulator from Aluminum nitride.

9. The method of claim 1 wherein forming the first insulator includes forming the first insulator to have a dielectric constant no less than approximately 5.0.

10. The method of claim 1 wherein forming the first insulator includes forming the first insulator to have a dielectric constant no less than approximately 8.5.

11. The method of claim 1 wherein forming the fourth conductor includes forming the fourth conductor to have a pattern of a patch antenna.

12. The method of claim 1 wherein forming the fourth conductor includes forming the fourth conductor to have a pattern of one of an antenna configured to form a substantially symmetrical pattern or an antenna configured to form multiple patterns.

13. The method of claim 1 further including forming a second protective coating covering the fourth conductor and at least a portion of the first insulator.

14. The method of claim 1 further including forming a second protective coating covering the fourth conductor.

15. A semiconductor device package having an antenna comprising:
    a substrate having interconnected semiconductor devices on the substrate, the semiconductor devices connected together by conductors on the substrate, the substrate having interconnect conductors at a periphery of the substrate;
    a protective coating covering the semiconductor devices and having sides that extend away from the substrate, the protective coating not covering at least a portion of the interconnect conductors;
    a first conductor on the sides of the protective coating and directly electrically connected to a first interconnect conductor of the interconnect conductors;
    a second conductor on the protective coating and directly electrically connected to a second interconnect conductor of the interconnect conductors, the second conductor electrically connected to a first semiconductor device of the semiconductor devices wherein the first semiconductor device is configured to drive the second conductor with an RF signal;
    an insulator on at least a portion of the first conductor and the second conductor; and
    a third conductor on the insulator and electrically connected to the second conductor wherein the first semiconductor device is configured to drive the third conductor and the second conductor with the RF signal.

16. The semiconductor device package of claim 15 wherein the third conductor is configured in a pattern of an antenna.

17. A method of forming a semiconductor device having an antenna comprising:
    providing a first protective coating covering a substrate having semiconductor devices on the substrate;
    forming a first conductor and a second conductor overlying the first protective coating including forming the second conductor electrically connected to a first semiconductor device of the semiconductor devices;

forming a first insulator on the first conductor and the second conductor; and forming a fourth conductor in a pattern of an antenna on the first insulator including electrically connecting the fourth conductor to the second conductor wherein the first semiconductor device is configured to apply an RF signal to the fourth conductor.

18. The method of claim 17 including forming the first conductor electrically connected to common reference of the substrate.

19. The method of claim 17 wherein forming the fourth conductor in the pattern of the antenna includes depositing conductor material in the pattern of the antenna.

20. The method of claim 17 wherein forming the fourth conductor in the pattern of the antenna includes forming conductor material on the first insulator and removing portions of the conductor material.

* * * * *